US008286055B2

(12) United States Patent  (10) Patent No.: US 8,286,055 B2
Rho  (45) Date of Patent: Oct. 9, 2012

(54) NONVOLATILE MEMORY DEVICE AND METHOD OF OPERATING THE SAME

(75) Inventor: Jun Rye Rho, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 465 days.

(21) Appl. No.: 12/647,676

(22) Filed: Dec. 28, 2009

(65) Prior Publication Data

US 2010/0199138 A1    Aug. 5, 2010

(30) Foreign Application Priority Data

Feb. 2, 2009  (KR) .................. 10-2009-0008060

(51) Int. Cl.
*G06F 11/00*  (2006.01)
(52) U.S. Cl. .................. 714/768; 714/763; 365/230.08
(58) Field of Classification Search .................. None
See application file for complete search history.

(56) References Cited

U.S. PATENT DOCUMENTS

| 7,372,767 B2 * | 5/2008 | Kim ............... 365/230.06 |
| 2005/0213378 A1 * | 9/2005 | Chang ............... 365/185.03 |
| 2007/0011581 A1 * | 1/2007 | Nakanishi et al. ........... 714/768 |
| 2011/0072332 A1 * | 3/2011 | Tomlin ........... 714/763 |
| 2011/0157998 A1 * | 6/2011 | Yang ............... 365/185.22 |
| 2011/0299342 A1 * | 12/2011 | Kang ............... 365/185.25 |

FOREIGN PATENT DOCUMENTS

KR    1020070001668    1/2007

OTHER PUBLICATIONS

Notice of Allowance issued from Korean Intellectual Property Office on Nov. 4, 2010.

* cited by examiner

*Primary Examiner* — Christopher McCarthy
(74) *Attorney, Agent, or Firm* — IP & T Group LLP

(57)  ABSTRACT

A nonvolatile memory device includes a memory cell array configured to comprise memory cells coupled by bit lines and word lines, a page buffer unit configured to comprise page buffers and flag latches, wherein the page buffers, coupled to one or more of the bit lines, each are configured to comprise a plurality of latches for storing logic operation results for error correction and configured to store data read using a read voltage, and the flag latches each are configured to classify the page buffers into some page buffer groups each having a predetermined number and to store flag information indicating whether an error has occurred in each group, and an error detection code (EDC) checker configured to determine whether an error has occurred in each of the page buffer groups.

11 Claims, 4 Drawing Sheets

NONVOLATILE MEMORY DEVICE AND METHOD OF OPERATING THE SAME

CROSS-REFERENCE TO RELATED APPLICATION

Priority to Korean patent application number 10-2009-0008060 filed on Feb. 2, 2009, the entire disclosure of which is incorporated by reference herein, is claimed.

BACKGROUND

One or more embodiments relate to the operation of a nonvolatile memory device and, more particularly, to a nonvolatile memory device and a method of operating the same, which are capable of improving the reliability of data by reducing errors occurring when data is read.

A nonvolatile memory device includes a memory cell array, a row decoder, a page buffer unit, etc. The memory cell array includes a plurality of word lines extending in rows, a plurality of bit lines extending in columns, and a plurality of cell strings corresponding to the respective bit lines.

The row decoder, coupled to a string selection line, word lines, and a common source line, is placed on one side of the memory cell array. The page buffer unit coupled to the plurality of bit lines is placed on the other side of the memory cell array.

Recently, to further increase the degree of integration of flash memory cells, active research is being done on a multi-bit cell which is able to store plural data in a single memory cell. This type of a memory cell is called a multi-level cell (MLC). A memory cell capable of storing a single bit is called a single level cell (SLC).

FIG. 1 is a flowchart illustrating a data read operation of a nonvolatile memory device.

Referring to FIG. 1, the nonvolatile memory device reads data using a previously set read voltage in response to a read command at step S101.

Data bits having errors as a result of reading data using the read voltage are corrected by an error correction code (ECC) operation at step S103. Next, corrected data is outputted at step S105. To this end, the nonvolatile memory device stores an error detection code (EDC) for checking whether an error has occurred when storing data.

If the number of data bits having errors is a predetermined number or less, the ECC operation can be performed on the data bits. However, if the number of data bits having errors is too many to the extent that the ECC operation cannot be performed on the data bits, the nonvolatile memory device lowers a read voltage and performs a data read operation again using the lowered read voltage in order to reduce the number of data bits with errors.

As a nonvolatile memory device repeatedly performs program and erase operations, a distribution of the threshold voltages of memory cells is widened. Accordingly, if a data read voltage is lowered, memory cells with errors can be reduced. If the number of memory cells with errors is reduced, an ECC operation can be performed.

In the case where data is read from a first memory cell, determined to have an error when data was first read from the first memory cell, using a lowered read voltage, there is no way of determining whether data actually stored in the first memory cell was '0' or '1'.

That is, there is no method of determining whether the data stored in the first memory cell has been read as being '0' because data '1' (i.e., an erase state) was originally stored in the first memory cell, and the threshold voltage of the first memory cell greatly shifted higher, or whether the data stored in the first memory cell has been read as being '1' because data '0' (i.e., a program state) was originally stored in the first memory cell, and the threshold voltage of the first memory cell greatly dropped. Accordingly, there is concern regarding the reliability of error correction.

Furthermore, an ECC circuit is problematic in that it occupies a wide area when newly configuring a nonvolatile memory device.

BRIEF SUMMARY

One or more embodiments relate to a nonvolatile memory device and a method of operating the same, which are capable of performing error correction by determining the program characteristic of a memory cell having an error when reading data in a nonvolatile memory device.

A nonvolatile memory device according to an aspect of this disclosure includes a memory cell array configured to comprise memory cells coupled by bit lines and word lines, a page buffer unit configured to comprise page buffers and flag latches, wherein the page buffers, coupled to one or more of the bit lines, each are configured to comprise a plurality of latches for storing logic operation results for error correction and configured to store data read using a read voltage, and the flag latches each are configured to classify the page buffers into some page buffer groups each having a predetermined number and to store flag information indicating whether an error has occurred in each group, and an error detection code (EDC) checker configured to determine whether an error has occurred in each of the page buffer groups.

Each of the page buffers includes a first latch configured to store the read data, a second latch configured to store the read data of the first latch, determine whether an error has occurred, and perform error correction, and a third latch configured to perform a logic operation on the data stored in the first and second latches and store an operation result.

If the data of the third latch is a first data, it is determined that an error has occurred in data read from a corresponding page buffer.

The third latch performs an exclusive OR (XOR) operation on the data stored in the first and second latches and stores the operation result.

According to another aspect of this disclosure, there is provided a method of operating a nonvolatile memory device including a plurality of memory cells and page buffers coupled to the memory cells, the method including performing a first read operation using a first read voltage on memory cells, selected from among the plurality of memory cells, and storing first data, read by the first read operation, in second latches of the page buffers, classifying the page buffers into two or more groups and determining whether erroneously read data exist in the first data stored in the second latches of each of the two or more groups, if the erroneously read data is determined to exist in the first data stored in the second latches of a first group of the two or more groups, performing a second read operation on the first group using a second read voltage less than the first read voltage, and storing second data, read by the second read operation, in first latches of page buffers belonging to the first group, storing a result of performing a logic operation on the first and second data in third latches of the page buffers belonging to the first group, and determining whether a first logic data exists in the data stored in the third latches of the page buffers belonging to the first group, wherein if the first logic data is determined to exist in the data stored in the third latches, counting a number of the first logic data, determining whether the number of first logic data is a number of bits or less for which error correction is possible, and if the number of first logic data is determined to be the number of bits or less for which error correction is possible, performing the error correction for the first group.

The method further includes, if the first logic data is determined not to exist in the data stored in the third latches of the page buffers belonging to the first group, performing a third read operation using a third read voltage less than the second read voltage, and storing third data, read by the third read operation, in first latches of page buffers belonging to a corresponding group, storing a result of performing a logic operation on the third and first data in third latches of the page buffers belonging to the corresponding group, and determining whether a first logic data exists in the data stored in the third latches of the page buffers belonging to the corresponding group, wherein if the first logic data is determined to exist in the data stored in the third latches belonging to the corresponding group, counting a number of the first logic data, determining whether the number of first logic data is a number of bits or less for which error correction is possible, and if the number of first logic data is determined to be the number of bits or less for which error correction is possible, performing the error correction for the corresponding group.

The logic operation may be an XOR operation, and the first logic data may be data '1'.

The method further includes determining whether an error has occurred in a second group determined to include erroneously read data in the first data, and determining whether error correction for the second group is possible, while performing the error correction for the first group.

The method further includes, if the number of first logic data determined to exist in the data stored in the third latches of the page buffers belonging to the first group is greater than the number of bits for which error correction is possible, determining that error correction for the first group is impossible, and storing a flag data indicative of the occurrence of error, determining whether a number of times in which the flag data has been stored is less than a set value, and if the number of times in which the flag data has been stored is determined to be less than the set value, sending the second or third data now being stored in the first latches to the second latches, reading fourth data by performing a fourth read operation using a fourth read voltage less than a third read voltage, and storing the fourth data in the first latches of the page buffers belonging to the first group, storing a result of performing a logic operation on the data stored in the first and second latches of the page buffers belonging to the first group, in the third latches of the page buffers belonging to the first group, and determining whether a first logic data exists in the data stored in the third latches of the page buffers belonging to the first group, wherein if the first logic data is determined to exist in the data stored in the third latches, counting a number of the first logic data, determining whether the number of first logic data is a number of bits or less for which error correction is possible, and if the number of first logic data is determined to be the number of bits or less for which error correction is possible, performing the error correction for the first group.

The method further includes performing a logic operation on the fourth data stored in the first latches and the data stored in the second latches, of the page buffers belonging to the first group, storing a result of the logic operation in the third latches of the page buffers belonging to the first group, determining whether first logic data exists in the data stored in the third latches of the page buffers belonging to the first group, and if the first logic data is determined not to exist in the data stored in the third latches, reading fifth data by performing a fifth read operation using a fifth read voltage less than the fourth read voltage, and storing the fifth data in the first latches of the page buffers belonging to the first group, performing a logic operation on the data stored in the first and second latches of the page buffers belonging to the first group and storing a result of the logic operation in the third latches of the page buffers, and if the first logic data is determined to exist in the data stored in the third latches belonging to the first group, counting a number of the first logic data, determining whether error correction for the first group is possible, and if error correction for the first group is determined to be possible, performing the error correction for the first group.

Performing the error correction includes setting a critical value of an error correction cycle for n bits, where n is a positive integer, that can be corrected to $2^n-1$ and setting a cycle to zero, changing data stored in an error correction latch for a page buffer having the third latch in which the first logic data is stored, and determining whether an error has occurred in the page buffer, and if an error is determined to have occurred, increasing the error correction cycle by one time while an error correction cycle frequency is less than the critical value, and changing the data stored in the second latch for a page buffer having the logic operation latch in which the first logic data is stored, until an error is determined not to have occurred.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
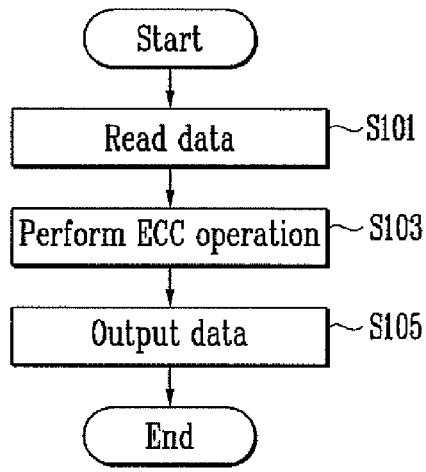
FIG. 1 is a flowchart illustrating a data read operation of a nonvolatile memory device.
Figure 2A:
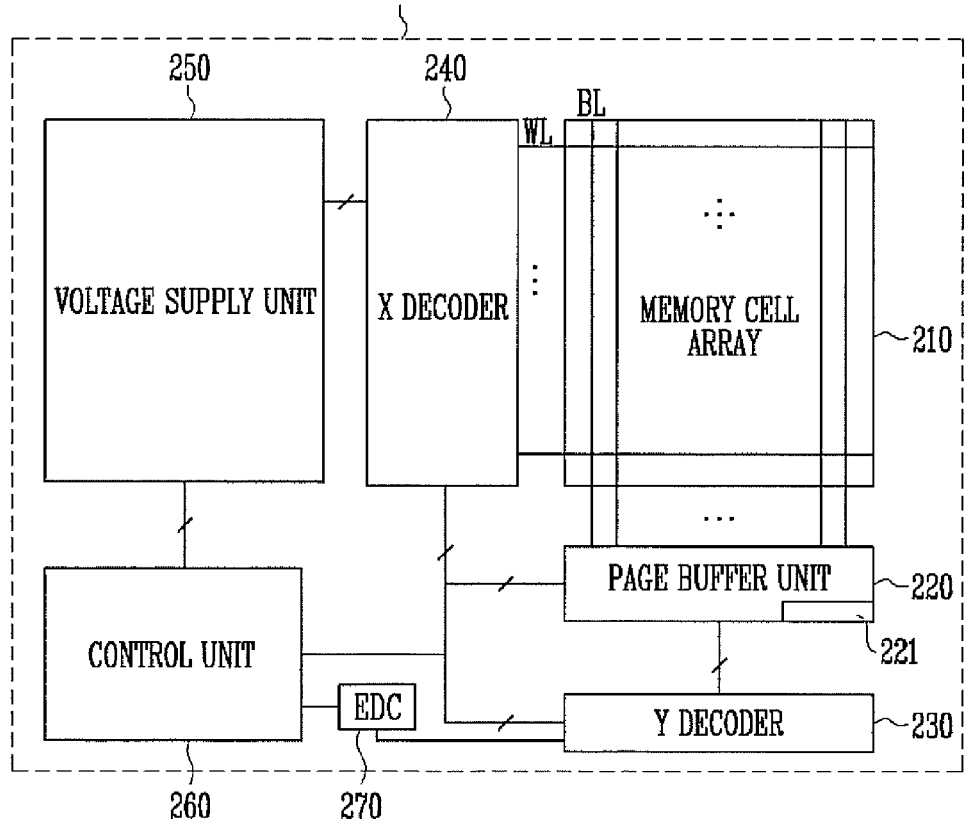
FIG. 2A is a block diagram of a nonvolatile memory device according to an embodiment of this disclosure.

FIG. 2A is a block diagram of a nonvolatile memory device according to an embodiment of this disclosure.

Referring to FIG. 2A, the nonvolatile memory device 200 includes a memory cell array 210, a page buffer unit 220, a Y decoder 230, an X decoder 240, a voltage supply unit 250, a control unit 260, and an EDC checker 270.

The memory cell array 210 includes a number of memory cells. A number of the memory cells are divided into memory blocks. Furthermore, the memory cells are coupled to bit lines and word lines.

The page buffer unit 220 includes page buffers PB. Each of the page buffers PB is coupled to one or more bit lines. The page buffer PB is configured to store data to be programmed into a selected memory cell or to read data stored in a selected memory cell and store the read data by means of a selected bit line and a selected word line.

Furthermore, according to an embodiment of this disclosure, the page buffers PB are grouped into ECC units each including a predetermined number of page buffers PB. The occurrence of an error and error correction are performed on an ECC-unit basis. To this end, in an embodiment of this disclosure, an error check code (ECC) of 1 bit is stored for every 15 bits of data. Thus, the page buffers PB are classified into ECC units, where each ECC unit includes 16 page buffers PB and a flag latch FL for storing information about the occurrence of an error, so that 16 bits may be stored.

The Y decoder 230 is configured to provide a data IO path to the page buffers PB. The X decoder 240 is configured to enable a memory block selected in response to an input address and to couple the word lines within the memory block and a global word line for supplying operating voltages.

The voltage supply unit 250 is configured to generate the operating voltages supplied to the global word line. The control unit 260 is configured to control the entire operation of the nonvolatile memory device.

Furthermore, the EDC checker 270 checks whether an error has occurred on an ECC-unit basis using an error check code.

The construction of the page buffer PB is described in more detail below.

Figure 2B:
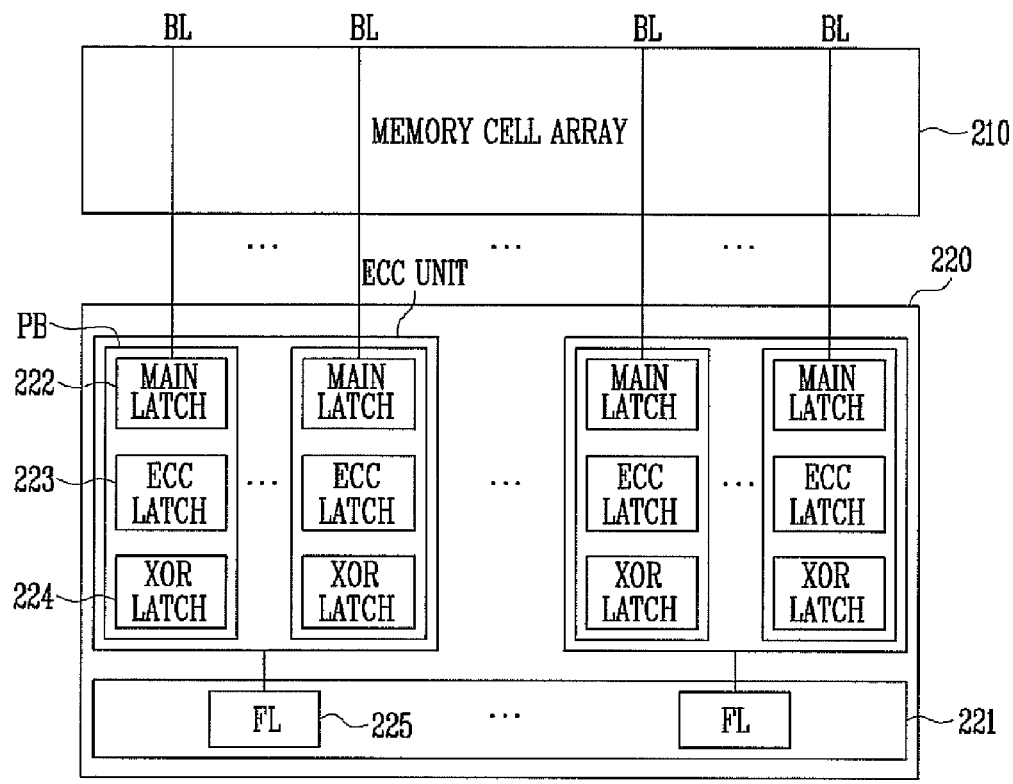
FIG. 2B is a block diagram of the page buffer unit shown in FIG. 2A.

FIG. 2B is a block diagram of the page buffer unit 220 shown in FIG. 2A.

The page buffer unit 220 includes a flag latch unit 221 and page buffers PB, which are coupled to the bit lines of the memory cell array 210. The page buffers PB are grouped into the ECC units in groups of 16 page buffers, and one of the flag latches (FLs) 225 of the flag latch unit 221 is coupled to each ECC unit.

The page buffers PB each include a main latch 222, an ECC latch 223, and an exclusive OR (XOR) latch 224.

The main latch 222 is configured to store data read from a selected memory cell coupled to a bit line. Furthermore, the ECC latch 223 is configured to store data received from the main latch 222. The XOR latch 224 is configured to perform an XOR operation on data stored in the main latch 222 and the ECC latch 223, and to store the operation results.

If data stored in the XOR latch 224 is '1', it means that data stored in the main latch 222 and data stored in the ECC latch 223 differ from each other. If data stored in the XOR latch 224 is '0', it means that data stored in the main latch 222 and data stored in the ECC latch 223 are identical to each other.

Accordingly, a position where an error has occurred can be checked using data stored in the XOR latch 224 because it can be determined that an error has occurred in a page buffer PB having data '1' stored in its XOR latch 224.

Figure 2C:
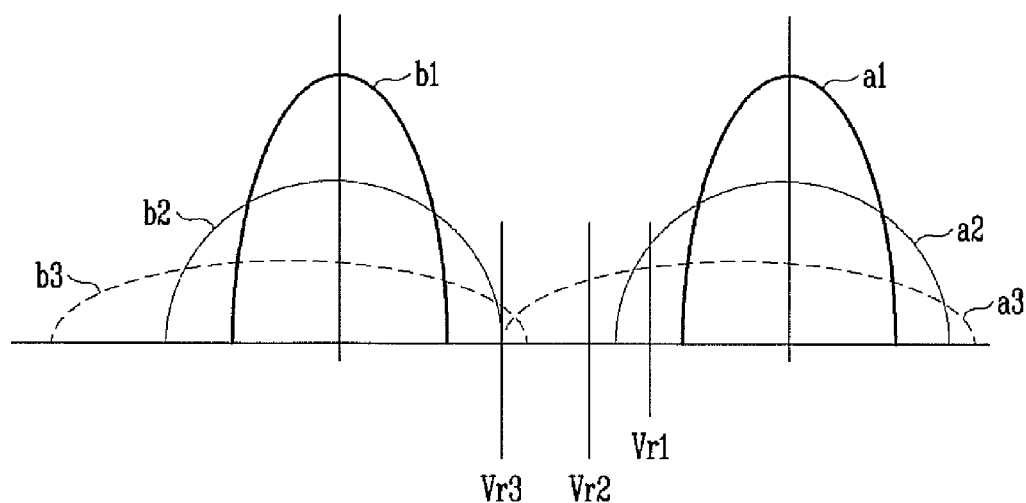
FIG. 2C shows distributions of program threshold voltages of the memory cells of the memory cell array shown in FIG. 2A.

FIG. 2C shows distributions of program threshold voltages of the memory cells of the memory cell array shown in FIG. 2A.

More specifically, FIG. 2C shows distributions of the threshold voltages of normal memory cells including programmed memory cells, having a first program threshold voltage distribution a1, and erase cells not programmed, having a first erase threshold voltage distribution b1.

If program and erase operations are repeatedly performed on the memory cells, the first program and erase threshold voltage distributions a1, b1 are respectively changed into second program and erase threshold voltage distributions a2, b2, and may eventually be changed into third program and erase threshold voltage distributions a3, b3.

When the memory cells have the first program and erase threshold voltage distributions a1, b1, data is read from the memory cells using a first read voltage Vr1. In the case where the first program and erase threshold voltage distributions a1, b1 of the memory cells are changed into the second program and erase threshold voltage distributions a2, b2, if data is read using the first read voltage Vr1, data of those memory cells having the second program threshold voltage distribution a2 is erroneously read. However, in this case, if data is read by changing a read voltage into a second read voltage Vr2, the data can be correctly read.

However, if the second program and erase threshold voltage distributions a2, b2 of the memory cells are changed into the third program and erase threshold voltage distributions a3, b3, a read voltage can be lowered to a third read voltage Vr3. However, even though the read voltage is lowered to the third read voltage Vr3, data of those memory cells having the third erase threshold voltage distribution b3 may be erroneously read.

Furthermore, although the read voltage is lowered, memory cells having a state '0' may be read as being a state '1', and memory cells having a state '1' may be read as being a state '0'. Accordingly, data error correction has to be performed according to the state of each memory cell.

To prevent data errors resulting from changing threshold voltage distributions, in an embodiment of this disclosure, the following read and error correction operations are performed.

Figure 3A:
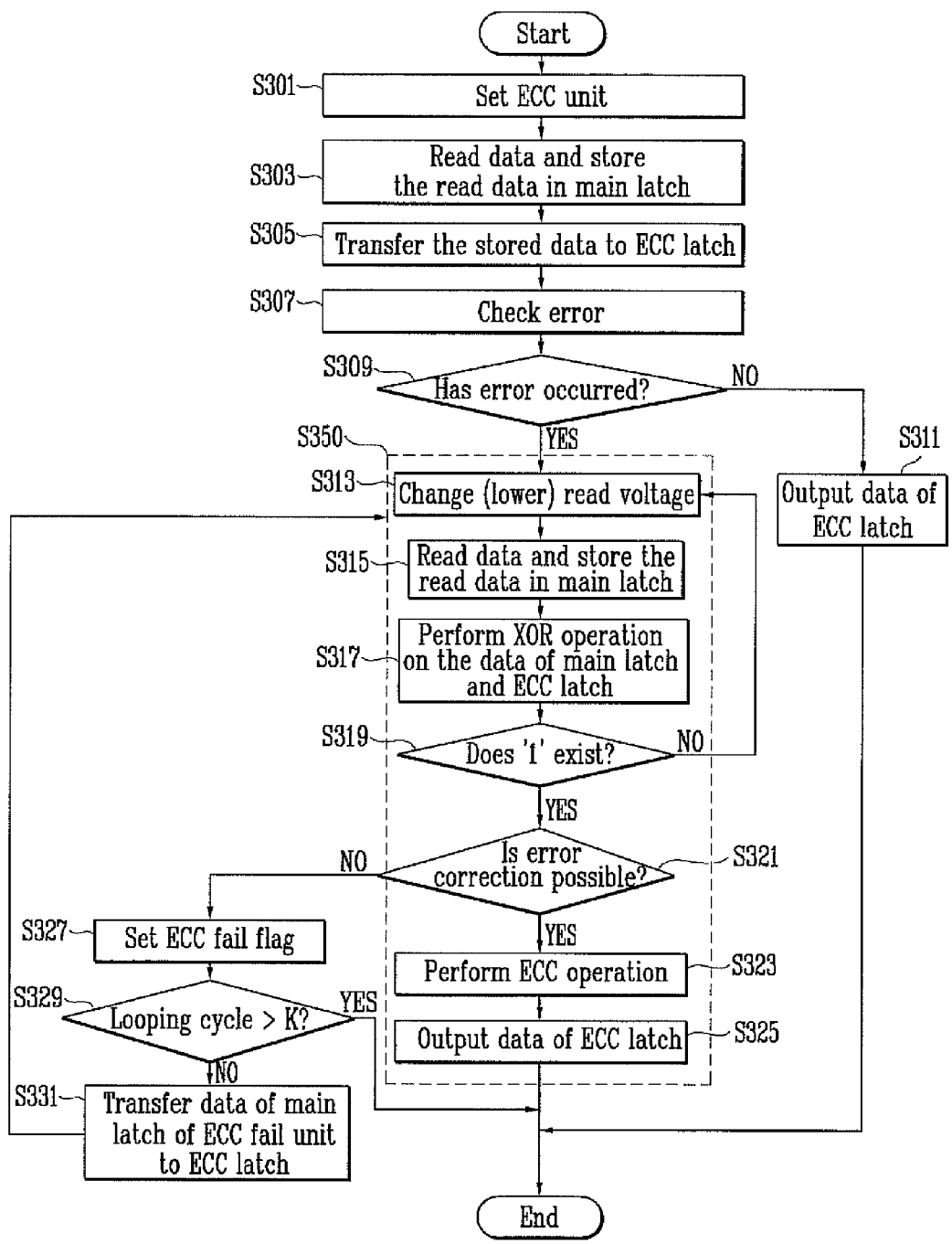
FIG. 3A is a flowchart illustrating a read operation of the nonvolatile memory device according to an embodiment of this disclosure.

FIG. 3A is a flowchart illustrating a read operation of the nonvolatile memory device according to an embodiment of this disclosure.

Referring to FIG. 3A, according to the embodiment of this disclosure, a number of the page buffers PB are grouped into the ECC units each having 16 page buffers at step S301. The EDC checker 270 determines whether an error has occurred based on data stored in one page buffer PB of each of the ECC units in which actual data is stored in the remaining 15 page buffers PB of each ECC unit.

The data is read on a page basis in response to a read command and is then stored in the main latch 222 at step S303. Here, the data read operation is performed by applying a read voltage Vread1 to a word line coupled to the gate of a selected memory cell and providing a pass voltage to the remaining word lines. The data read operation is well known in the art, and a detailed description thereof is omitted for simplicity.

The data stored in the main latch 222 is transferred to the ECC latch 223 for error correction at step S305. The EDC checker 270 determines whether an error has occurred on an ECC-unit basis at step S307.

It is determined whether an error has occurred in the first ECC unit at step S309. If, as a result of the determination, it is determined that an error has not occurred in the first ECC unit, it is determined whether an error has occurred in the second ECC unit. As described above, it is sequentially determined whether an error has occurred in all the ECC units. If, as a result of the determination, an error is determined not to have occurred in all the ECC units, the data stored in the ECC latch 223 is outputted at step S311.

However, if, as a result of the determination, an error is determined not to have occurred in any one of all the ECC units, the process moves to a process of correcting the error (step S350) before checking whether an error has occurred in a next ECC unit.

The process of correcting the error (S350) includes setting a read voltage Vread2 less than the read voltage Vread1, set when performing the read operation at step S303, at step S313. After setting the read voltage Vread2, the data is read again and stored in the main latch 222 at step S315.

An XOR operation is then performed on the data stored in the main latch 222 and the ECC latch 223, and an operation result is stored in the XOR latch 224 at step S317.

As a result of the XOR operation, if the two pieces of data (i.e., the data in the main latch 222 and the data in the ECC latch 223) differ from each other, data '1' is outputted, and if the two pieces of data are identical with other, data '0' is outputted. Accordingly, if it is determined that the data stored in the XOR latch 223 is data '1', then it is determined that an error has occurred in a corresponding bit.

After storing the XOR operation result in the XOR latch 223, it is determined whether data '1' has been stored in the XOR latches 223 of all the ECC units at step S319. If, as a result of the determination, data '1' is determined not to have been stored in the XOR latches 223 of all the ECC units, the process returns to step S313 in which the read voltage is lowered to a read voltage Vread3 and the data read operation is performed again. However, if, as a result of the determination at step S319, data '1' is determined to have been stored in any one of the XOR latches 223 of the ECC units, the number of data '1' stored in the XOR latches 223 are counted, and it is determined whether the data having an error can be corrected at step S321.

As a result of the determination at step S321, if the number of data '1' is n bits or less (where, for example, 'n' is a positive integer), it is determined that error correction for a corresponding ECC unit is possible, and an ECC operation is performed at step S323. However, as a result of the determination at step S321, if the number of data '1' exceeds 'n', it is determined that error correction for a corresponding ECC unit is impossible, and ECC fail flag information is stored in the corresponding flag latch FL 225 at step S327.

It is then determined whether a loop cycle for the ECC unit, in which the ECC fail flag information is stored at step S327, exceeds a critical value K (where, for example, K is a positive integer) at step S329. To this end, the control unit 260 stores information about the loop cycle in which the read operation is performed again because of a fail occurring on an ECC unit basis. The loop indicates the number of times that an error has occurred and the number of times that data '1' in the XOR latch 224 has exceeded 'n' thereby enabling error correction.

If, as a result of the determination at step S329, the loop cycle is determined to have exceeded the critical value K, it is determined that an error has occurred in the read operation, and the process is finished.

However, if, as a result of the determination at step S329, the loop cycle is determined not to have exceeded the critical value K, the data of the main latch 222 is transferred to the corresponding ECC latch 223 at step S331, and the process returns to step S350 in which the error correction operation is performed on a fail ECC unit.

The error correction process (S350) can be performed simultaneously with the process of performing the ECC operation on a fail ECC unit (S323). That is, while the ECC operation is performed, the error correction process (S350) is performed on a next ECC unit, and thus, the time that it takes to perform error correction can be reduced.

As described above, error correction is performed only on an ECC unit that has detected an error. Accordingly, the operation time can be reduced because it is not necessary to perform error correction on all the page buffers PB.

Meanwhile, the process of performing the ECC operation (S323) can be performed as follows.

Figure 3B:
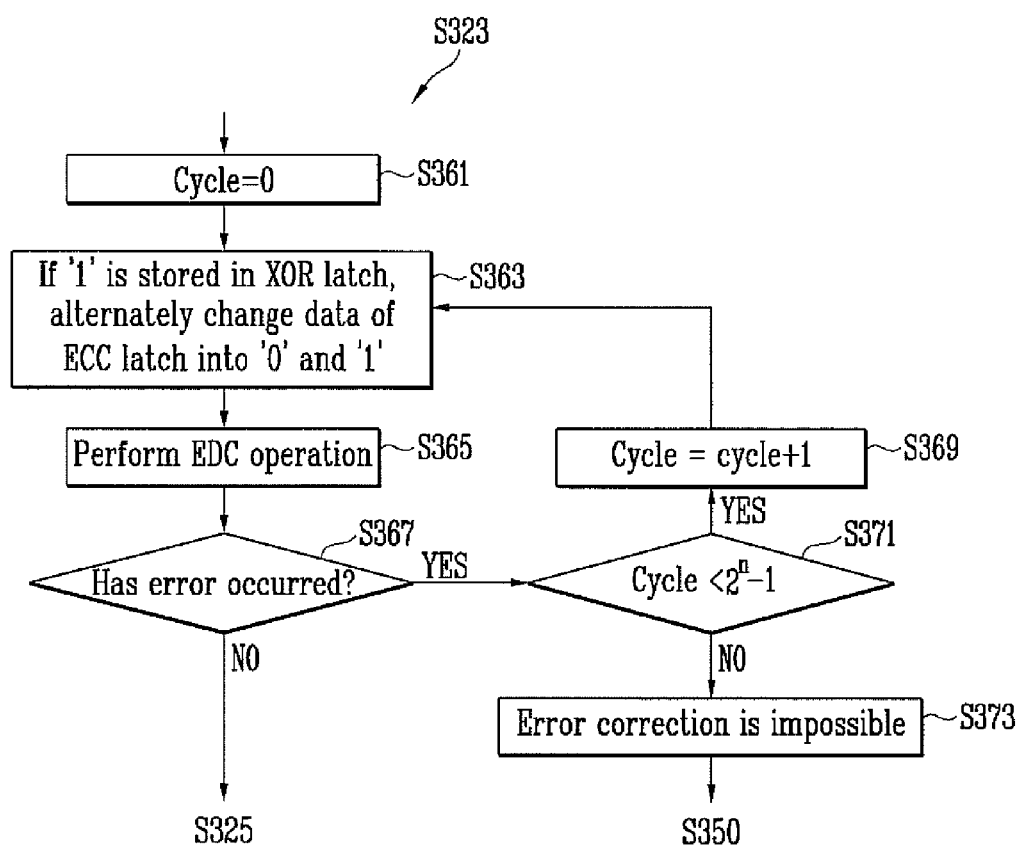
FIG. 3B is a flowchart illustrating a process of performing an ECC operation shown in FIG. 3A.

FIG. 3B is a detailed flowchart illustrating the process of performing the ECC operation shown in FIG. 3A.

Referring to FIG. 3B, to perform the ECC operation, first, a cycle frequency is reset '0' at step S361. If the data of the XOR latch 224 is '1', it can be determined that an error has occurred in the data coupled to a corresponding page buffer PB.

The cycle frequency is defined such that the cycle is changed up to $2^n-1$ when the number of data '1' is set to 'n' in the XOR latch 223 for determining whether the ECC operation has to be performed within an ECC unit.

A detailed example of the ECC operation is described below.

Only four bits are taken as an example. If data stored in the ECC latch 223 is '1001' and data stored in the XOR latch 224 is '0110', it can be determined that an error has occurred in two bits of each of '1001' and '0110', which are placed at the center.

Accordingly, the cycle is set to '0' at step S361. Then, at step S363, the data of the ECC latch 223 of a page buffer PB including an XOR latch 224 having data '1' is alternately changed to '1' and '0'.

That is, in the state in which data '1001' is stored in the ECC latch 223, the data '1001' is changed into data '1011' at step S363. It is then determined whether an error has occurred in the changed data using the EDC checker 270 at step S365 and S367. If, as a result of the determination, an error is determined not to have occurred in the changed data, it means that error correction has been completed, and the process returns to step S325.

However, if, as a result of the determination at steps S365 and S367, an error is determined to have occurred (i.e., an error has not been corrected even after the change of the data, it is determined whether the cycle is less than $2^n-1$ (for example, here, it is determined if the cycle is less than 3 times) at step S371. If, as a result of the determination at step S371, the cycle is determined to be less than 3 times, the cycle is increased by one at step S369, and the process returns to step S363 in which the data stored in the ECC latch 223 is changed (for example, here, data stored in the ECC latch 223 is changed to data '1111').

Next, it is then determined whether an error has occurred in the changed data using the EDC checker 270 at step S365 and S367. If, as a result of the determination, an error is determined not to have occurred in the changed data, it means that error correction has been completed, and the process returns to step S325.

However, if, as a result of the determination at step S365 and S367, an error is determined to have occurred (i.e., an error has not been corrected even after the change of the data, it is determined whether the cycle is less than $2^n-1$, (for example, here, it is determined if the cycle is less than 3 times) at step S371. If, as a result of the determination at step S371, the cycle is determined to be 3 times or more, it is determined that error correction for the changed data is impossible at step S373, and the process returns to step S350

As described above, error correction is performed by changing only the value of the ECC latch 223 in which the data stored in the XOR latch 224 is '1' until the cycle is $2^n-1$ times or more.

According to this disclosure, to reduce a load occurring because of the number of times that a data read operation must be performed for error correction is increased and the number of times that an error has to be detected for error correction is increased, an ECC operation and an error correction operation for a next ECC unit are performed at the same time.

As described above, error correction is performed differently for a memory cell having an error when reading data according to a program characteristic. Accordingly, reliability of error correction can be improved.

What is claimed is:

1. A nonvolatile memory device, comprising:
   a memory cell array configured to comprise memory cells coupled by bit lines and word lines;

a page buffer unit configured to comprise page buffers and flag latches, wherein the page buffers, coupled to one or more of the bit lines, each are configured to comprise a plurality of latches for storing logic operation results for error correction and configured to store data read using a read voltage, and the flag latches each are configured to classify the page buffers into some page buffer groups each having a predetermined number and to store flag information indicating whether an error has occurred in each group; and an error detection code (EDC) checker configured to determine whether an error has occurred in each of the page buffer groups.

2. The nonvolatile memory device of claim 1, wherein each of the page buffers comprises:
a first latch configured to store the read data;
a second latch configured to store the read data of the first latch, determine whether an error has occurred, and perform error correction; and
a third latch configured to perform a logic operation on the data stored in the first and second latches and store an operation result.

3. The nonvolatile memory device of claim 2, wherein it is determined that an error has occurred in data read from a corresponding page buffer, if the data of the third latch is a first data.

4. The nonvolatile memory device of claim 2, wherein the third latch performs an exclusive OR (XOR) operation on the data stored in the first and second latches and stores the operation result.

5. A method of operating a nonvolatile memory device comprising a plurality of memory cells and page buffers coupled to the memory cells, the method comprising:
performing a first read operation using a first read voltage on memory cells, selected from among the plurality of memory cells, and storing first data, read by the first read operation, in second latches of the page buffers;
classifying the page buffers into two or more groups and determining whether erroneously read data exist in the first data stored in the second latches of each of the two or more groups;
if the erroneously read data is determined to exist in the first data stored in the second latches of a first group of the two or more groups, performing a second read operation on the first group using a second read voltage less than the first read voltage, and storing second data, read by the second read operation, in first latches of page buffers belonging to the first group;
storing a result of performing a logic operation on the first and second data in third latches of the page buffers belonging to the first group; and
determining whether a first logic data exists in the data stored in the third latches of the page buffers belonging to the first group,
wherein if the first logic data is determined to exist in the data stored in the third latches, counting a number of the first logic data, determining whether the number of first logic data is a number of bits or less for which error correction is possible, and
if the number of first logic data is determined to be the number of bits or less for which error correction is possible, performing the error correction for the first group.

6. The method of claim 5, further comprising:
if the first logic data is determined not to exist in the data stored in the third latches of the page buffers belonging to the first group, performing a third read operation using a third read voltage less than the second read voltage, and storing third data, read by the third read operation, in first latches of page buffers belonging to a corresponding group;
storing a result of performing a logic operation on the third and first data in third latches of the page buffers belonging to the corresponding group; and
determining whether a first logic data exists in the data stored in the third latches of the page buffers belonging to the corresponding group,
wherein if the first logic data is determined to exist in the data stored in the third latches belonging to the corresponding group, counting a number of the first logic data, determining whether the number of first logic data is a number of bits or less for which error correction is possible, and
if the number of first logic data is determined to be the number of bits or less for which error correction is possible, performing the error correction for the corresponding group.

7. The method of claim 6, wherein:
the logic operation is an XOR operation, and the first logic data is data '1'.

8. The method of claim 6, further comprising, determining whether an error has occurred in a second group determined to include erroneously read data in the first data, and determining whether error correction for the second group is possible, while performing the error correction for the first group.

9. The method of claim 6, wherein performing the error correction comprises:
setting a critical value of an error correction cycle for n bits, where n is a positive integer, that can be corrected to $2^n-1$ and setting a cycle to zero;
changing data stored in an error correction latch for a page buffer having the third latch in which the first logic data is stored, and determining whether an error has occurred in the page buffer; and
if an error is determined to have occurred, increasing the error correction cycle by one time while an error correction cycle frequency is less than the critical value, and changing the data stored in the second latch for a page buffer having the logic operation latch in which the first logic data is stored, until an error is determined not to have occurred.

10. The method of claim 5, further comprising:
if the number of first logic data determined to exist in the data stored in the third latches of the page buffers belonging to the first group is greater than the number of bits for which error correction is possible, determining that error correction for the first group is impossible, and storing a flag data indicative of the occurrence of an error;
determining whether a number of times in which the flag data has been stored are less than a set value;
if the number of times in which the flag data has been stored is determined to be less than the set value, sending the second or third data now being stored in the first latches to the second latches, reading fourth data by performing a fourth read operation using a fourth read voltage less than a third read voltage, and storing the fourth data in the first latches of the page buffers belonging to the first group;
storing a result of performing a logic operation on the data stored in the first and second latches of the page buffers belonging to the first group, in the third latches of the page buffers belonging to the first group; and determining whether a first logic data exists in the data stored in the third latches of the page buffers belonging to the first group, wherein if the first logic data is determined to exist in the data stored in the third latches, counting a number of the first logic data, determining whether the number of first logic data is a number of bits or less for which error correction is possible, and if the number of first logic data is determined to be the number of bits or less for which error correction is possible, performing the error correction for the first group.

11. The method of claim 10, further comprising:

performing a logic operation on the fourth data stored in the first latches and the data stored in the second latches, of the page buffers belonging to the first group;

storing a result of the logic operation in the third latches of the page buffers belonging to the first group;

determining whether first logic data exists in the data stored in the third latches of the page buffers belonging to the first group;

if the first logic data is determined not to exist in the data stored in the third latches, reading fifth data by performing a fifth read operation using a fifth read voltage less than the fourth read voltage, and storing the fifth data in the first latches of the page buffers belonging to the first group;

performing a logic operation on the data stored in the first and second latches of the page buffers belonging to the first group and storing a result of the logic operation in the third latches of the page buffers; and if the first logic data is determined to exist in the data stored in the third latches belonging to the first group, counting a number of the first logic data, determining whether error correction for the first group is possible, and if error correction for the first group is determined to be possible, performing the error correction for the first group.

* * * * *